United States Patent
Kim et al.

(10) Patent No.: US 9,958,500 B2
(45) Date of Patent: May 1, 2018

(54) VACUUM SOCKET AND SEMICONDUCTOR TESTING SYSTEM INCLUDING THE SAME

(71) Applicant: Samsung Electronics Co., Ltd., Suwon-si (KR)

(72) Inventors: Jang-Sun Kim, Seoul (KR); Il Jin, Chungcheongnam-do (KR); Seungchul Lee, Chungcheongnam-do (KR)

(73) Assignee: Samsung Electronics Co., Ltd. (KR)

( * ) Notice: Subject to any disclaimer, the term of this patent is extended or adjusted under 35 U.S.C. 154(b) by 129 days.

(21) Appl. No.: 15/187,158

(22) Filed: Jun. 20, 2016

(65) Prior Publication Data

US 2017/0010324 A1 Jan. 12, 2017

(30) Foreign Application Priority Data

Jul. 8, 2015 (KR) .................. 10-2015-0097294

(51) Int. Cl.
G01R 31/00 (2006.01)
G01R 31/28 (2006.01)
G01R 1/04 (2006.01)

(52) U.S. Cl.
CPC ....... G01R 31/2893 (2013.01); G01R 1/0466 (2013.01)

(58) Field of Classification Search
CPC .............. G01R 1/0466; G01R 1/07314; G01R 31/2879; G01R 31/2886; G01R 31/2889; G01R 31/2896; G01R 1/0408; G01R 1/0433; G01R 1/0483; G01R 31/26; G01R 31/2808

See application file for complete search history.

(56) References Cited

U.S. PATENT DOCUMENTS

| 5,953,812 | A | 9/1999 | Ferrante | |
|---|---|---|---|---|
| 6,369,596 | B1* | 4/2002 | Anderson | G01R 1/0483 324/750.25 |
| 7,402,995 | B2 | 7/2008 | Adachi et al. | |
| 7,884,630 | B2 | 2/2011 | Osato et al. | |
| 2001/0026152 | A1* | 10/2001 | Kang | G01R 1/0408 324/750.2 |
| 2007/0287206 | A1* | 12/2007 | Makihara | G01R 1/0483 438/18 |

FOREIGN PATENT DOCUMENTS

| JP | 2005345271 | 12/2005 |
|---|---|---|
| JP | 2009025007 | 2/2009 |
| JP | 2014109454 | 6/2014 |
| KR | 20020044353 | 6/2002 |

(Continued)

*Primary Examiner* — Tung X Nguyen
(74) *Attorney, Agent, or Firm* — Onello & Mello, LLP (57) ABSTRACT

A vacuum socket includes a lower housing including a concave portion with a first hole, the concave portion having a recessed cross section and a printed circuit board in the concave portion, wherein the printed circuit board includes a second hole coupled to the first hole and pads provided along an edge region thereof, a cover provided in the concave portion to cover the printed circuit board, and a vacuum pad inserted in the first hole, the vacuum pad having a third hole coupled to the second hole, wherein the printed circuit board is electrically connected to a first semiconductor chip loaded between the printed circuit board and the cover, via the pads.

20 Claims, 8 Drawing Sheets

(56) References Cited

FOREIGN PATENT DOCUMENTS

| KR | 1020040098672 | 11/2004 |
| KR | 100675008 | 1/2007 |
| KR | 1020080060081 | 7/2008 |
| KR | 20100044300 | 2/2011 |
| KR | 20090089547 | 6/2011 |
| KR | 20110100403 | 10/2011 |

* cited by examiner

VACUUM SOCKET AND SEMICONDUCTOR TESTING SYSTEM INCLUDING THE SAME

CROSS-REFERENCE TO RELATED APPLICATION

This application claims priority under 35 U.S.C. § 119 to Korean Patent Application No. 10-2015-0097294, filed on Jul. 8, 2015, in the Korean Intellectual Property Office, the entire content of which is hereby incorporated by reference.

BACKGROUND

Example embodiments of the inventive concepts relate to a vacuum socket, and in particular, to a vacuum socket with a vacuum pad and a semiconductor testing system including the same.

Recently, with the development of information communication technology, various types of semiconductor devices have been developed. A semiconductor device should be fabricated to have improved characteristics in performance and reliability. To evaluate reliability of the semiconductor device, a test process is performed using a testing system. The testing system includes a testing part, in which sockets for testing a state of electrical connection between a memory chip and a logic chip are provided.

SUMMARY

Example embodiments of the inventive concepts provide a testing system with a vacuum socket, allowing a semiconductor chip to be picked up and tested in a unitary manner, not in a dualistic manner.

Other example embodiments of the inventive concepts provide a vacuum socket, allowing a memory chip to be fastened to a logic chip and be tested, not even in a state of a package-on-package structure.

According to example embodiments of the inventive concepts, a vacuum socket may include a lower housing including a concave portion with a first hole, the concave portion having a recessed cross section, a printed circuit board positioned in the concave portion, wherein the printed circuit board includes a second hole coupled to the first hole and pads along an edge region thereof, a cover positioned in the concave portion to cover the printed circuit board, and a vacuum pad inserted in the first hole, the vacuum pad having a third hole coupled to the second hole, wherein the printed circuit board is electrically connected to a first semiconductor chip loaded between the printed circuit board and the cover, via the pads.

In some embodiments, the printed circuit board may have at least one conduit formed on a top surface thereof, and the conduit may have a recessed cross section in a direction from a top surface toward a bottom surface of the printed circuit board and may be coupled to the second hole to serve as an air flow pathway.

In some embodiments, the conduit may comprise a plurality of conduits, and the plurality of the conduits may be disposed in a symmetric manner with respect to the second hole.

In some embodiments, when viewed in plan view, the conduits may include a first conduit and a second conduit, each of which extends from the second hole toward an edge of the printed circuit board, and the first and second conduits may extend substantially perpendicular to each other.

In some embodiments, the conduit may be disposed spaced apart from the pads.

In some embodiments, the vacuum pad may be configured to be in contact with a second semiconductor chip, when the second semiconductor chip is picked up by the vacuum pad.

In some embodiments, a bottom surface of the printed circuit board may define an insertion part, which is recessed from the bottom surface of the printed circuit board and allows a portion of the vacuum pad to be inserted therein, and the insertion part may be overlapped with the second hole, when viewed in plan view.

In some embodiments, the vacuum socket may further include a probe, passing through the concave portion of the lower housing and is exposed to an outside environment.

In some embodiments, the vacuum socket may further include a sealing layer between the concave portion and the printed circuit board.

In some embodiments, the sealing layer may include a polyimide film, and silicon layers on top and bottom surfaces, respectively, of the polyimide film.

In some embodiments, the vacuum socket may further include an upper housing disposed to be in contact with the lower housing and cover the cover.

In some embodiments, the cover may have a fourth hole, which is overlapped with the first hole and the second hole, when viewed in plan view.

According to example embodiments of the inventive concepts, a semiconductor testing system may include a loading part configured to convey first semiconductor chips, a testing part including a contact tool configured to perform test and pick-up operations on the first semiconductor chips, and an unloading part configured to unload the first semiconductor chips from the testing part. The contact tool may have a plurality of vacuum sockets, and each of the vacuum sockets may include a lower housing including a concave portion having a lower hole, the concave portion having a recessed cross section, a printed circuit board in the concave portion, the printed circuit board having a penetration hole coupled to the lower hole, a vacuum pad inserted in the lower hole coupled to the penetration hole , and an upper housing on the lower housing, the upper housing having an upper hole overlapped with the lower hole, when viewed in plan view. The printed circuit board may include conduit, which is configured to allow air to flow from the penetration hole and the vacuum pad toward the upper hole and is used as an air flow pathway.

In some embodiments, the loading part may include a first loading part and a second loading part, which are configured to move the first semiconductor chips to the testing part.

In some embodiments, the contact tool may include a first contact tool adjacent to the first loading part, and a second contact tool adjacent to the second loading part.

In some embodiments, the conduits may extend from the penetration hole toward an edge of the printed circuit board.

According to example embodiments of the inventive concepts, a vacuum socket may include a printed circuit board configured to load a semiconductor chip on a top surface thereof and having a penetration hole, a cover disposed on the semiconductor chip, a lower housing disposed to cover side surfaces of the printed circuit board, the semiconductor chip and the cover, and a bottom surface of the printed circuit board. The lower housing having a lower hole coupled to and overlapped with the penetration hole, when viewed in plan view, and a vacuum pad inserted in the lower hole. The printed circuit board may have at least one conduit formed on a top surface thereof. The conduit may be connected to the penetration hole and be used as an air flow pathway, allowing air to be pumped out to an outside of the printed circuit board.

In some embodiments, the conduit may have a recessed vertical section in a direction from a top surface toward a bottom surface of the printed circuit board. The conduit may have a depth ranging from 0.1 mm to 0.2 mm and a width ranging from 0.05 mm to 0.12 mm.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
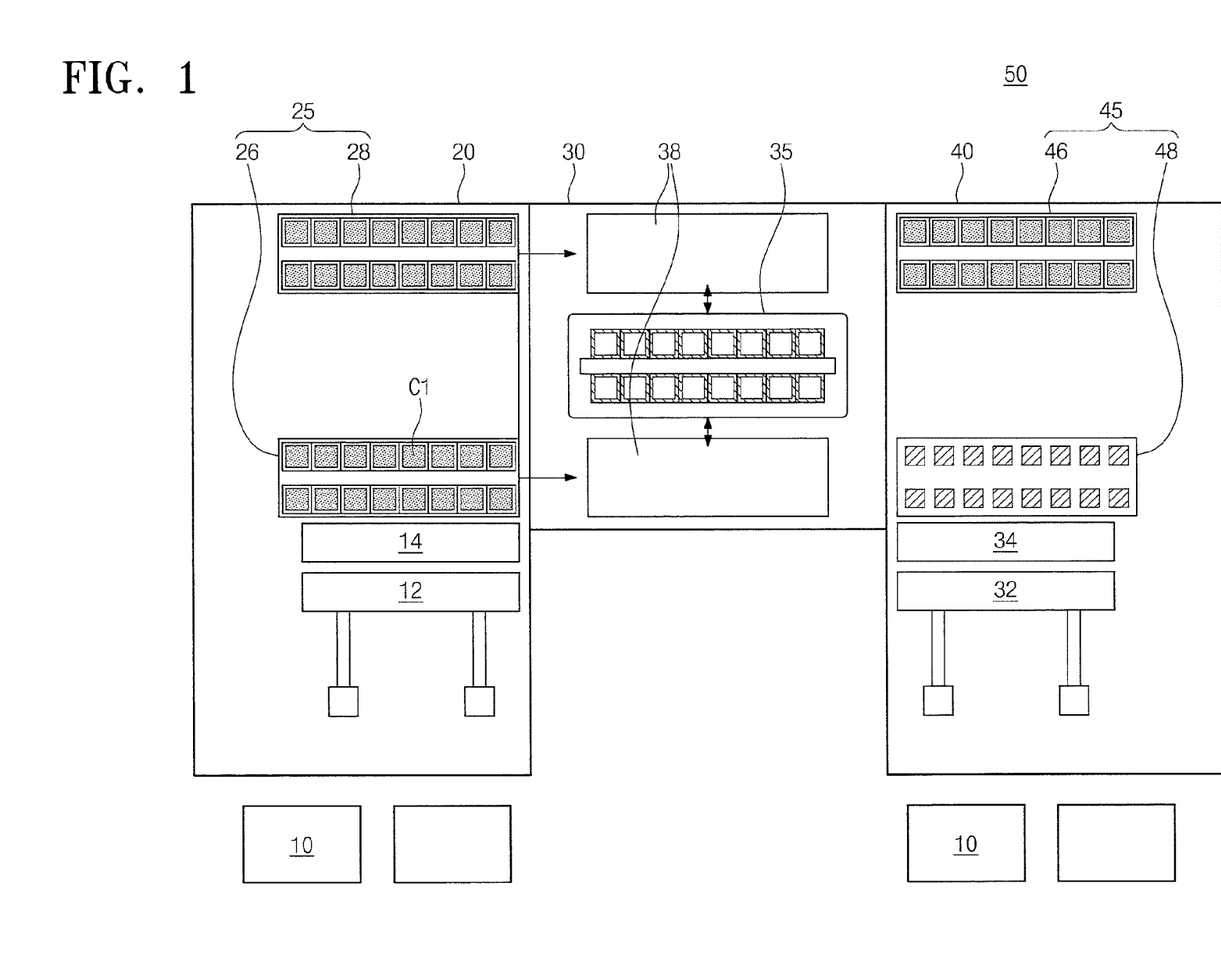
FIG. 1 is a schematic diagram illustrating a testing system configured to test a semiconductor chip according to example embodiments of the inventive concepts.

FIG. 1 is a schematic diagram illustrating a testing system configured to test a semiconductor chip according to example embodiments of the inventive concepts.

Referring to FIG. 1, a semiconductor testing system 50 may include a loading part 20, a testing part 30, and an unloading part 40. The loading part 20 may be configured to transfer first semiconductor chips C1 from a stacker 10 to the testing part 30. The first semiconductor chips C1 may be logic chips (e.g., application processor (AP) chips). The stacker 10 may include at least one tray, in which the first semiconductor chips C1 are loaded. The stacker 10 may be disposed at a region of a front side of the semiconductor testing system 50. The loading part 20 may include an input module 12, a loading buffer 14, and a loading shuttle 25.

The input module 12 may be configured to pick up the first semiconductor chips C1 from the stacker 10. Furthermore, the input module 12 may be configured to transfer the first semiconductor chips C1 to the loading buffer 14.

The loading buffer 14 may be configured to align the first semiconductor chips C1 and heat up the first semiconductor chips C1 to a predetermined temperature. The semiconductor testing system 50 may further include at least one robot (not shown), which is configured to move the first semiconductor chips C1 from the loading buffer 14 to the loading shuttle 25.

The loading shuttle 25 may be configured to transfer the first semiconductor chips C1 to the testing part 30. In some embodiments, the loading shuttle 25 may include a first sub-loading shuttle 26 and a second sub-loading shuttle 28. Each of the first and second sub-loading shuttles 26 and 28 may be configured to perform the operation of transferring a plurality of the first semiconductor chips C1. Thus, by performing the transferring operation of the loading shuttle 25 once, it is possible to transfer, for example, thirty two first semiconductor chips C1 to the testing part 30. The loading shuttle 25 may be configured to move the first semiconductor chips C1 to a test site 35 of the testing part 30, while maintaining the first semiconductor chips C1 at the high temperature. The movement of the loading shuttle 25 may lead to a change in position of a remaining tray. An empty tray may be moved to a transfer rail (not shown).

The testing part 30 may be used to perform an electrical test operation on the first semiconductor chips C1. The testing part 30 may be disposed between the loading part 20 and the unloading part 40. The first semiconductor chips C1 may be moved to the test site 35 of the testing part 30 using the loading shuttle 25. A contact tool 38 may be provided in the testing part 30 and may be used to pick up the first semiconductor chips C1 and dispose the first semiconductor chips C1 on the test site 35. The contact tool 38 may include a vacuum socket (e.g., 1 of FIG. 2) that is configured to pick up the first semiconductor chips C1. In some embodiments, the vacuum socket (e.g., 1 of FIG. 2) of the contact tool 38 may be configured to pick up the first semiconductor chips C1, to move the first semiconductor chips C1 to the test site 35, and to apply test signals to the first semiconductor chips C1. In other words, it is possible to perform three different operations of moving the first semiconductor chips C1 to the test site 35, of applying the test signals to the first semiconductor chips C1 and of testing the first semiconductor chips C1, using a single apparatus (e.g., the vacuum socket), and this makes it possible to simplify the test process and reduce a test time taken to perform the test process.

The unloading part 40 may be configured to unload the first semiconductor chips C1 from the testing part 30. The unloading part 40 may include an unloading shuttle 45, an unloading buffer 34, and an output module 32.

The unloading shuttle 45 may be used to move the first semiconductor chips C1 from the testing part 30 to the unloading part 40. For example, such a movement of the first semiconductor chips C1 may be performed, when the test operation on the first semiconductor chips C1 is finished. The unloading shuttle 45 may include a first sub-unloading shuttle 46 and a second sub-unloading shuttle 48. Furthermore, a robot (not shown) may be used to move the first semiconductor chips C1 from the unloading shuttle 45 to the unloading buffer 34.

The unloading buffer 34 may be used to temporarily store the first semiconductor chips C1. The output module 32 may be used to move the first semiconductor chips C1 into the stacker 10. The first semiconductor chips C1 may be classified into good and bad (i.e., passed and failed) ones, based on test results obtained from the test operation. The output module 32 may be configured to sort the first semiconductor chips C1, based on the classification, and to separately keep the good and bad ones of the first semiconductor chips C1 in different areas of the stacker 10.

Figure 2:
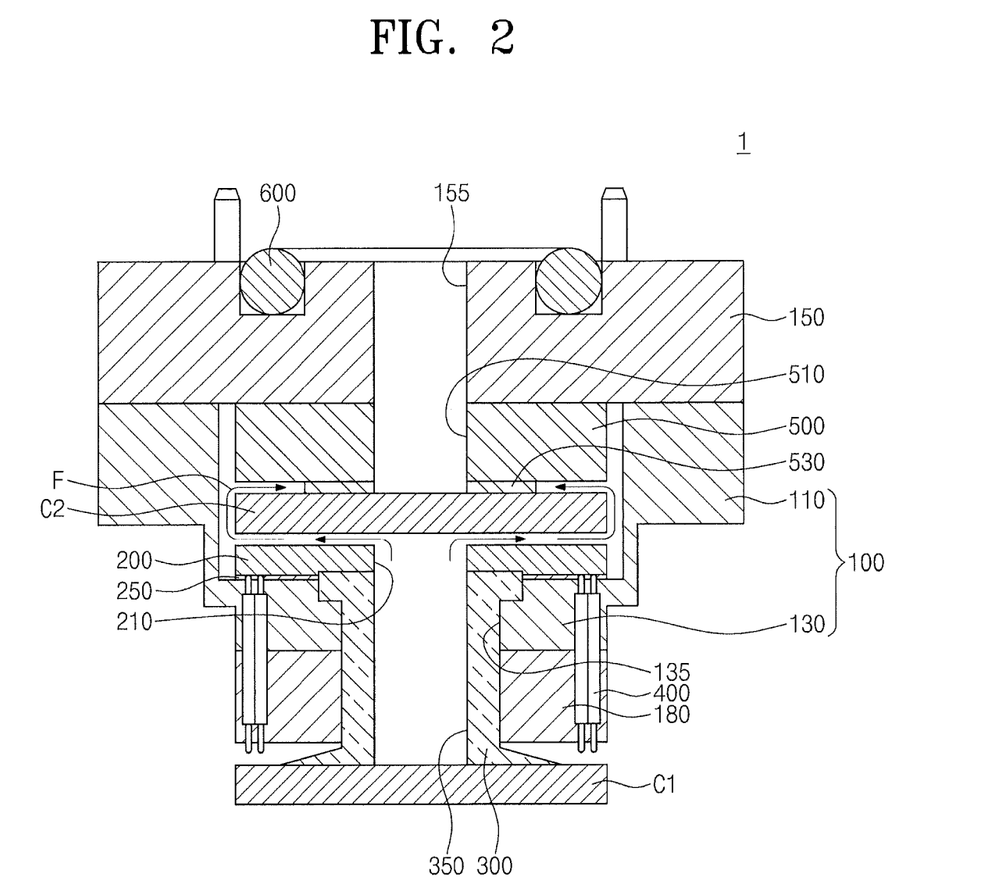
FIG. 2 is a sectional view illustrating a vacuum socket according to example embodiments of the inventive concepts.
Figure 3:
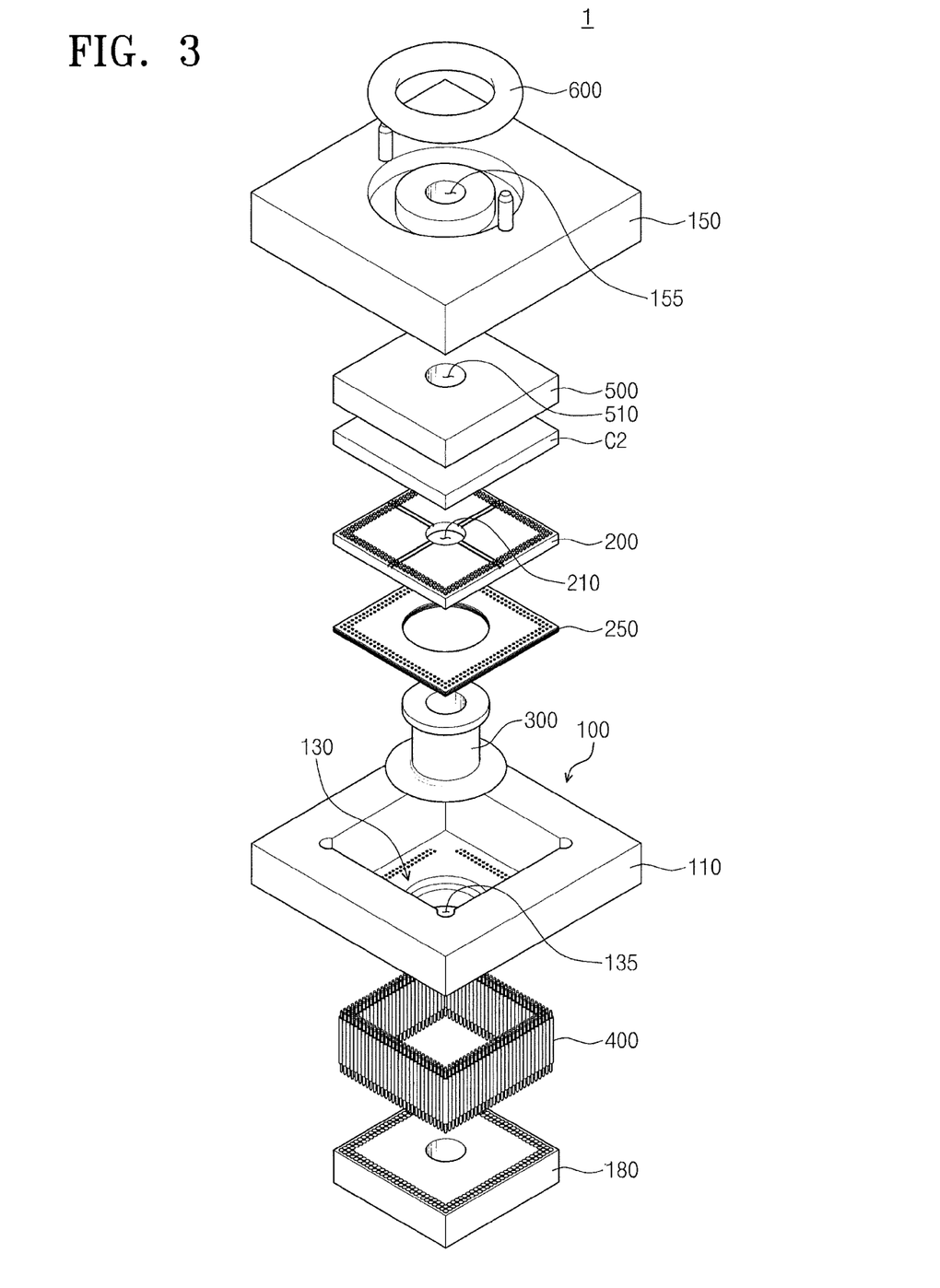
FIG. 3 is an exploded perspective view illustrating a vacuum socket according to example embodiments of the inventive concepts.

FIG. 2 is a sectional view illustrating a vacuum socket according to example embodiments of the inventive concepts, and FIG. 3 is an exploded perspective view illustrating a vacuum socket according to example embodiments of the inventive concepts.

Referring to FIGS. 2 and 3, a vacuum socket 1 may include a lower housing 100, an upper housing 150, a printed circuit board 200, a vacuum pad 300, a probe 400, and a cover 500.

The lower housing 100 may include a body portion 110, which is in contact with the upper housing 150, and a concave portion 130, which is provided below the body portion 110 to define a downwardly recessed region. The concave portion 130 may have a first lower hole 135. A base cover 180 may be disposed on a bottom surface of the lower housing 100.

The upper housing 150 may be disposed on the body portion 110 to cover the cover 500. The upper housing 150 may have an upper hole 155, which is overlapped with the first lower hole 135 in plan view. A sealing ring 600 may be disposed on the upper housing 150. The sealing ring 600 may be configured to prevent breakage of the contact tool (e.g., 38 of FIG. 1) and the vacuum socket 1, which occur when the contact tool (e.g., 38 of FIG. 1) and the vacuum socket 1 are in contact with each other. For example, the sealing ring 600 may be formed of, or may otherwise include, rubber.

The printed circuit board 200 may be disposed on the concave portion 130 of the lower housing 100. The printed circuit board 200 may have a penetration hole 210, which is overlapped with the first lower hole 135 and the upper hole 155 in plan view. A second semiconductor chip C2 may be loaded on the printed circuit board 200. The second semiconductor chip C2 may be a memory chip. For example, the second semiconductor chip C2 may be loaded on the printed circuit board 200 in a flip-chip manner. The printed circuit board 200 may be configured to allow the second semiconductor chip C2 to be electrically connected to the probe 400.

A sealing layer 250 may be disposed between the printed circuit board 200 and the concave portion 130. The sealing layer 250 may be provided to hermetically seal an internal space, which is delimited by the printed circuit board 200 and the concave portion 130, from the outside atmosphere, and this may make it possible to allow air to flow through the penetration hole 210 and the first lower hole 135, without any leakage.

The vacuum pad 300 may be inserted in the first lower hole 135 of the concave portion 130 and may be provided to be in contact with the printed circuit board 200. The vacuum pad 300 may have a pad hole 350, whose sidewall may be coplanar with that of the penetration hole 210. For example, the pad hole 350 may be overlapped with the penetration hole 210, when viewed in plan view. The vacuum pad 300 may be in contact with the first semiconductor chip C1, during the pick-up step of the first semiconductor chip C1.

The probe 400 may be provided to pass through the concave portion 130 and the base cover 180. When viewed in plan view, the probe 400 may be disposed along an edge region of the concave portion 130. The probe 400 may have a plurality of pins electrically connecting the printed circuit board 200 to the first semiconductor chip C1. In some embodiments, in plan view, the plurality of pins may be disposed in a ring shape. In certain embodiments, each of the rings may have a plurality of pins electrically connecting the printed circuit board 200 to the first semiconductor chip C1. The probe 400 may allow test signals, which are applied to the second semiconductor chip C2 from a tester (not shown), to be transmitted to the first semiconductor chip C1. For example, the tester can test the first and second semiconductor chips C1 and C2, via the probe 400.

The cover 500 may be disposed on the second semiconductor chip C2. The cover 500 may have a cover hole 510, which is overlapped with the first lower hole 135, the upper hole 155, and the penetration hole 210 in plan view. In certain embodiments, the cover hole 510 may have a sidewall coplanar with that of the upper hole 155.

The pad hole 350, the first lower hole 135, the penetration hole 210, the cover hole 510, the upper hole 155, and gaps which are provided between the printed circuit board 200 and the second semiconductor chip C2, and between the cover 500 and the second semiconductor chip C2 may serve as an air flow pathway F, allowing air to flow therethrough. In some embodiments, the vacuum socket 1 may be configured to allow the air flow pathway F to have a vacuum-like pressure, and thus, the first semiconductor chip C1 can be picked up by the vacuum pad 300. Accordingly, there is no need to provide an additional apparatus for moving the first semiconductor chip C1. In addition, since the second semiconductor chip C2 is embedded in the vacuum socket 1, it is possible to test the first and second semiconductor chips C1 and C2, without an additional process.

In addition, even when the first and second semiconductor chips C1 and C2 are not yet packaged in a package-on-package structure, the use of the vacuum socket 1 may allow for a testing operation on the first and second semiconductor chips C1 and C2. Thus, when the first semiconductor chip C1 is determined to be a failed chip, it is possible to discard only the first semiconductor chip C1, and to retain the second semiconductor chip C2, and thereby to reduce a fabrication cost of a semiconductor device. For example, the first semiconductor chip C1 may be a logic chip, and the second semiconductor chip C2 may be a memory chip. Here, in the case where the logic chip is failed, it is possible to prevent the memory chip from being discarded. Also, it is possible to test and utilize the logic chip independently, as opposed to the memory chip as packaged on the logic chip. When a testing operation is performed on the first semiconductor chip C1, there is no need to replace the second semiconductor chip C2, which is loaded in the vacuum socket 1, with a new one.

Figure 4:
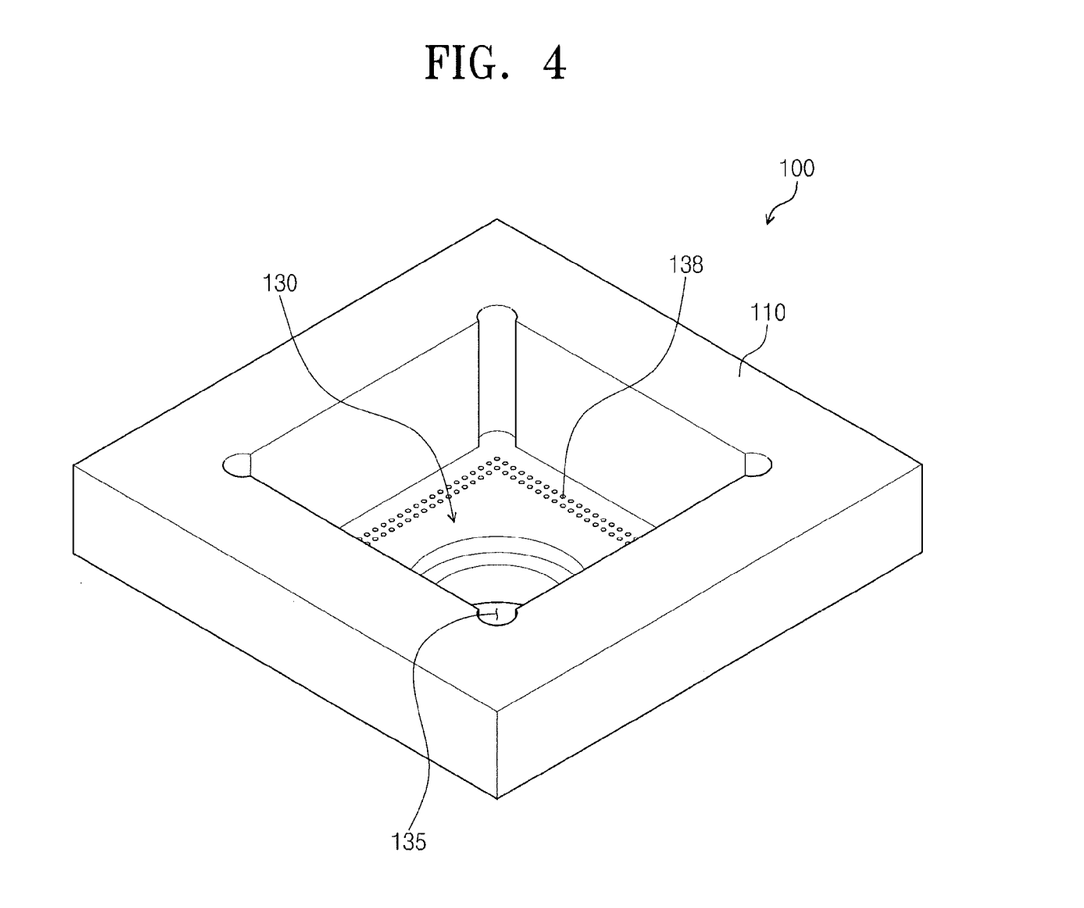
FIG. 4 is a perspective view illustrating a lower housing according to example embodiments of the inventive concepts.

FIG. 4 is a perspective view illustrating a lower housing according to example embodiments of the inventive concepts.

Referring to FIGS. 2 through 4, the lower housing 100 may include the body portion 110 and the concave portion 130. The concave portion 130 may be provided below the body portion 110 to define a downwardly recessed region. The concave portion 130 may have rounded corners. In this case, it is possible to prevent the printed circuit board 200, the second semiconductor chip C2, and the cover 500, which are provided in the concave portion 130 and have a rectangular shape, from being broken by the contact with the concave portion 130. The concave portion 130 may have the first lower hole 135 and a second lower hole 138 penetrating the concave portion 130. The first lower hole 135 may be provided at a center of the concave portion 130, and a plurality of the second lower holes 138 may be arranged along an edge region of the concave portion 130. The vacuum pad 300 may be inserted in the first lower hole 135 and may be provided to be in contact with the printed circuit board 200 provided in the concave portion 130. The probe 400 may be inserted in the second lower hole 138 and may be in contact with a bottom surface of the printed circuit board 200 provided in the concave portion 130.

Figure 5A:
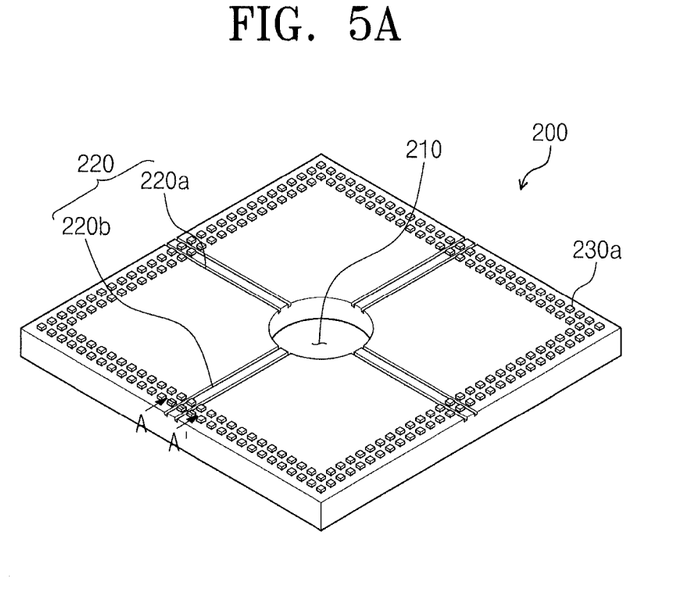
FIG. 5A is a perspective view illustrating a top portion of a printed circuit board according to example embodiments of the inventive concepts.
Figure 5B:
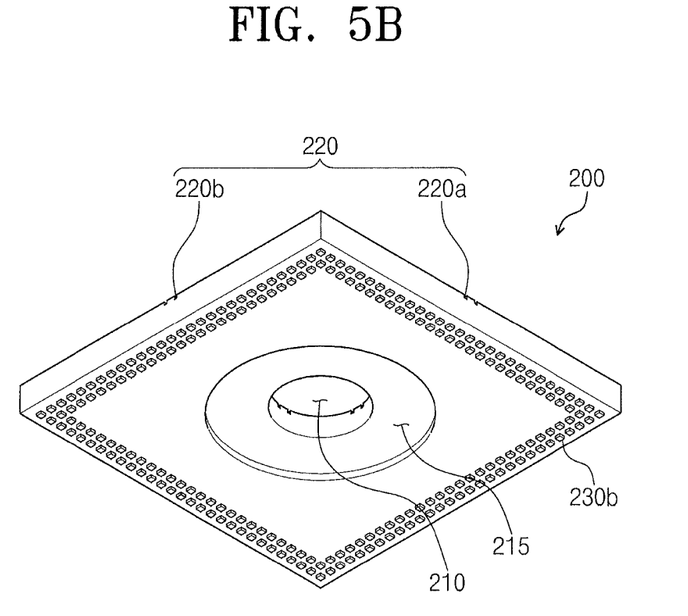
FIG. 5B is a perspective view illustrating a bottom portion of a printed circuit board according to example embodiments of the inventive concepts.
Figure 5C:
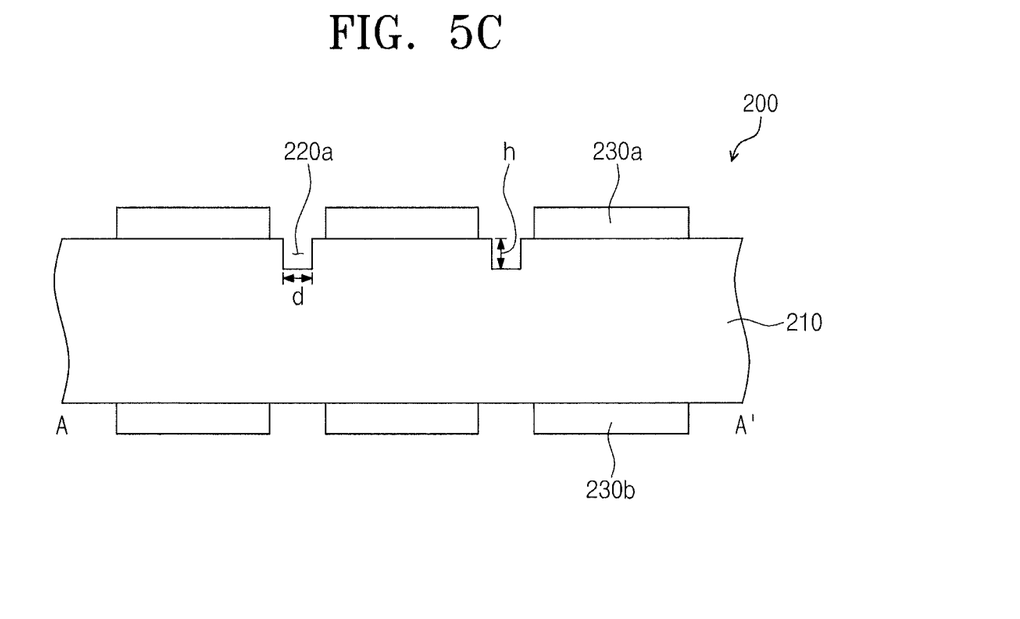
FIG. 5C is a sectional view taken along line A-A' of FIG. 5A.

FIG. 5A is a perspective view illustrating a top portion of a printed circuit board according to example embodiments of the inventive concepts, FIG. 5B is a perspective view illustrating a bottom portion of a printed circuit board according to example embodiments of the inventive concepts, and FIG. 5C is a sectional view taken along line A-A' of FIG. 5A.

Referring to FIGS. 2, 3, and 5A, the printed circuit board 200 may be provided to have a conduit 220, in addition to the penetration hole 210, and an upper pad 230a may be disposed on the printed circuit board 200. The penetration hole 210 may penetrate the printed circuit board 200. The penetration hole 210 may extend to the vacuum pad 300. The conduit 220 may be provided on the printed circuit board 200. The conduit 220 may have a recessed cross section in a direction from a top surface toward a bottom surface of the printed circuit board 200 and may extend from the penetration hole 210 toward edge sides of the printed circuit board 200. The conduit 220 may include a first conduit 220a and a second conduit 220b. The first conduit 220a and the second conduit 220 may be symmetrically disposed in all directions with respect to the penetration hole 210, and the first conduit 220a may extend in a direction perpendicular to the second conduit 220b. In certain embodiments, the conduit 220 may include a plurality of the first conduits 220a and a plurality of the second conduit 220b. The conduit 220 may serve as an air flow pathway, allowing air flowing from the penetration hole 210 to flow therethrough. In certain embodiments, the printed circuit board 200 may include a plurality of the upper pads 230a, which are arranged along an edge region of the top surface of the printed circuit board 200. The upper pad 230a may be electrically connected to the second semiconductor chip C2.

Referring to FIGS. 2, 3, and 5B, an insertion part 215 and a lower pad 230b may be provided on the bottom surface of the printed circuit board 200. The insertion part 215 may be formed to define a space, in which a portion of the vacuum pad 300 can be inserted. The insertion part 215 may be overlapped with the penetration hole 210, when viewed in plan view, and the insertion part 215 may have a diameter that is greater than that of the penetration hole 210. A plurality of the lower pads 230b may be arranged along an edge region of the bottom surface of the printed circuit board 200. The lower pad 230b and the probe 400 may be in physical contact with each other and may be electrically connected to each other.

Referring to FIGS. 2, 3, 5A, and 5C, a pair of the first conduits 220a may be provided on the printed circuit board 200. The first conduits 220a may be recessed in a direction from a top surface toward a bottom surface of the printed circuit board 200. For example, the first conduits 220a may have a depth h of 0.1 mm to 0.2 mm and a width d of 0.05 mm to 0.12 mm. However, the depth h and the width d of the first conduits 220a may not necessarily be limited to specific values, and moreover, the second conduits 220b may also have the same depth and the same width as those of the first conduits 220a. The first conduits 220a may be spaced apart from each other. The upper and lower pads 230a and 230b may be provided on top and bottom surfaces, respectively, of the printed circuit board 200. The upper pad 230a and the lower pad 230b may be overlapped with each other, when viewed in plan view.

Figure 6:
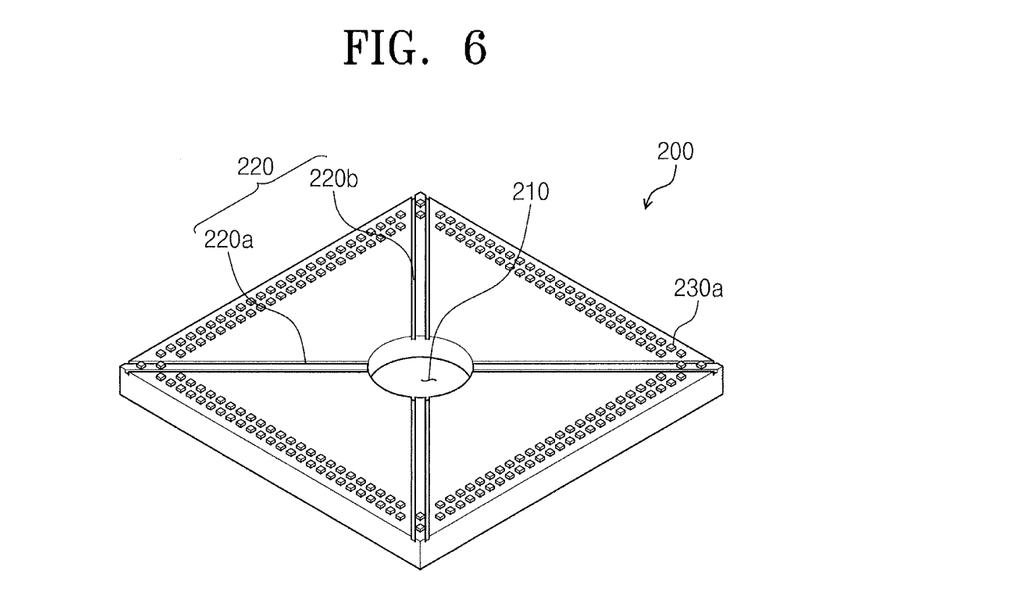
FIG. 6 is a perspective view illustrating a top portion of a printed circuit board according to other example embodiments of the inventive concepts.

FIG. 6 is a perspective view illustrating a top portion of a printed circuit board according to other example embodiments of the inventive concepts.

Referring to FIGS. 2, 3, and 6, the first conduits 220a and the second conduits 220b may extend from the penetration hole 210 toward corners of the printed circuit board 200. In certain embodiments, the extension direction of the first conduits 220a may not be perpendicular to that of the second conduits 220b.

Although not described in the above example, the numbers and arrangements of the first and second conduits 220a and 220b may be variously changed.

Figure 7:
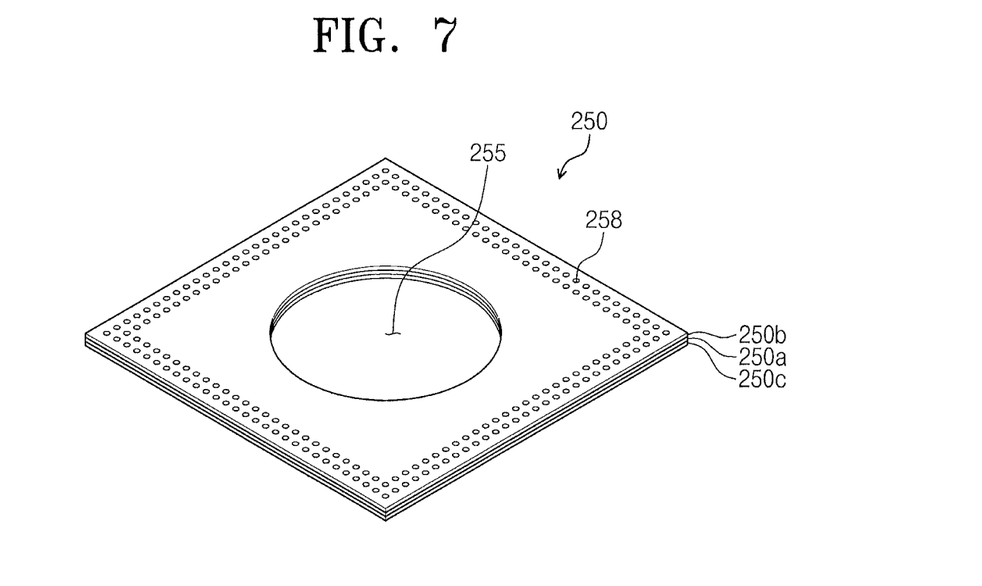
FIG. 7 is a perspective view illustrating a sealing layer according to example embodiments of the inventive concepts.

FIG. 7 is a perspective view illustrating a sealing layer according to example embodiments of the inventive concepts.

Referring to FIGS. 2, 3, and 7, the sealing layer 250 may include a polyimide film 250a and silicon layers 250b and 250c. The silicon layers 250b and 250c are provided on top and bottom surfaces, respectively, of the polyimide film 250a. The sealing layer 250 may be configured to hermetically seal an internal space, which is delimited by the printed circuit board 200 and the lower housing 100, from the outside atmosphere, and moreover, the sealing layer 250 may have a first film hole 255 and a second film hole 258. The vacuum pad 300 may be inserted in the first film hole 255, and the probe 400 may be inserted in the second film hole 258. The sealing layer 250 may be provided between the concave portion 130 and the printed circuit board 200 and may prevent air from being leaked from the vacuum pad 300 to the outside of the penetration hole 210.

Figure 8:
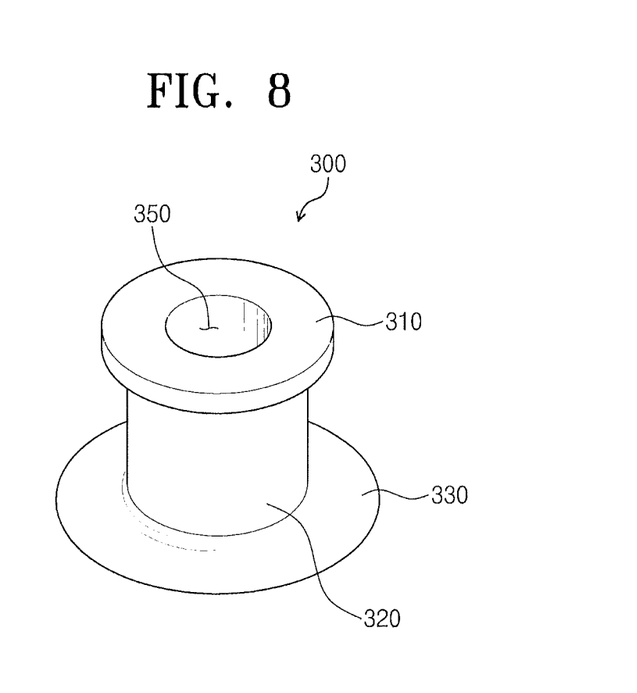
FIG. 8 is a perspective view illustrating a vacuum pad according to example embodiments of the inventive concepts.

FIG. 8 is a perspective view illustrating a vacuum pad according to example embodiments of the inventive concepts.

Referring to FIGS. 2, 3, and 8, the vacuum pad 300 may be inserted in the first lower hole 135 of the concave portion 130. The vacuum pad 300 may include a first portion 310, a second portion 320, and a third portion 330, which are respectively positioned at upper, middle, and lower levels thereof. The first portion 310 may be in contact with the insertion part 215 of the printed circuit board 200. The second portion 320 may connect the first portion 310 to the third portion 330. The second portion 320 may be shaped like a circular hollow cylinder. The third portion 330 may be in contact with the first semiconductor chip C1, when the vacuum pad 300 is used to pick up the first semiconductor chip C1. The third portion 330 may have a diameter larger than those of the first portion 310 and the second portion 320. The vacuum pad 300 may be provided to define the pad hole 350, allowing air to flow therethrough (i.e., serving as an air flow pathway). In some embodiments, by pumping out air in the pad hole 350, it is possible to decrease an internal pressure of the pad hole 350 to a pressure close to vacuum. In the case where the pad hole 350 is in a state of vacuum, the first semiconductor chip C1 can be picked up by the vacuum pad 300. The vacuum pad 300 may be formed of or include a soft elastic material (e.g., rubber).

Figure 9:
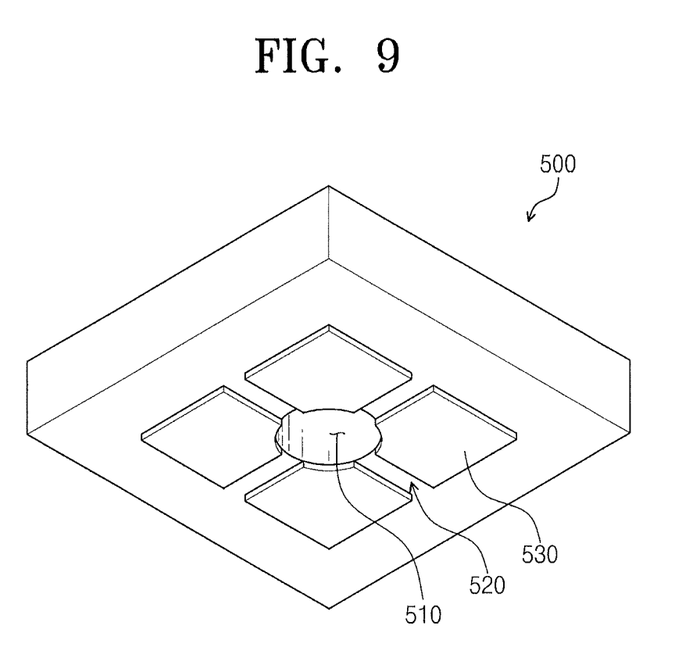
FIG. 9 is a perspective view illustrating a bottom portion of a cover according to example embodiments of the inventive concepts.

FIG. 9 is a perspective view illustrating a bottom portion of a cover according to example embodiments of the inventive concepts.

Referring to FIGS. 2, 3, and 9, the cover 500 may be provided to define the cover hole 510. The cover 500 may further comprise a cover pad 530 provided on a main body of the cover 500. The cover hole 510 may be overlapped with the upper hole 155, the penetration hole 210, and the pad hole 350, when viewed in plan view. For example, the cover hole 510 may have a sidewall that is substantially coplanar with that of the upper hole 155. The cover pad 530 may be in contact with the top surface of the second semiconductor chip C2, and this makes it possible to prevent process failures which may occur when the cover 500 is in direct contact with the second semiconductor chip C2. In addition, due to the presence of the cover pad 530, a gap 520 may be formed between the second semiconductor chip C2 and the cover 500, and such a gap 520 may serve as a pathway, allowing air to flow therethrough. In some embodiments, in the case where air is leaked out through a gap between the printed circuit board 200 and the second semiconductor chip C2, the air may flow into the cover hole 510 through the gap between the second semiconductor chip C2 and the cover 500.

According to example embodiments of the inventive concepts, a vacuum socket is configured to decrease a pressure of an inner space thereof to a vacuum-like pressure, and this makes it possible to pick up and test a logic chip without an additional apparatus.

It was described that the first semiconductor chip C1 is the logic chip and the second semiconductor chip C2 is the memory chip, but not limited to. Alternately, the first semiconductor chip C1 may be the memory chip and the second semiconductor chip C2 may be the logic chip.

According to example embodiments of the inventive concepts, even when logic and memory chips are not yet packaged in a package-on-package structure, it is possible to perform a testing operation on each of the logic and memory chips, and thus, when the memory chip or the logic chip is determined to have a failure, it is possible to selectively discard the failed one of the logic chip or the memory chip, rather than both, thereby reducing the fabrication cost of a semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A vacuum socket, comprising:
   a lower housing including a concave portion with a first hole, the concave portion having a recessed cross section;
   a printed circuit board positioned in the concave portion, wherein the printed circuit board includes a second hole coupled to the first hole and pads positioned along an edge region thereof;
   a cover positioned in the concave portion to cover the printed circuit board; and
   a vacuum pad inserted in the first hole, the vacuum pad having a third hole coupled to the second hole,
   wherein the printed circuit board is electrically connected to a first semiconductor chip loaded between the printed circuit board and the cover, via the pads.

2. The vacuum socket of claim 1, wherein the printed circuit board has at least one conduit formed on a top surface thereof, and
   the conduit has a recessed cross section in a direction from a top surface toward a bottom surface of the printed circuit board and is coupled to the second hole to serve as an air flow pathway.

3. The vacuum socket of claim 2, wherein the conduit comprises a plurality of conduits, and the plurality of the conduits are disposed in a symmetric manner with respect to the second hole.

4. The vacuum socket of claim 2, wherein, when viewed in plan view, the conduit comprises a first conduit and a second conduit, each of which extends from the second hole toward an edge of the printed circuit board, and
   the first and second conduits extend substantially perpendicular to each other.

5. The vacuum socket of claim 2, wherein the conduit is positioned spaced apart from the pads.

6. The vacuum socket of claim 1, wherein the vacuum pad is configured to be in contact with a second semiconductor chip, when the second semiconductor chip is picked up by the vacuum pad.

7. The vacuum socket of claim I, wherein a bottom surface of the printed circuit board defines an insertion part, which is recessed from the bottom surface of the printed circuit board and allows a portion of the vacuum pad to be inserted therein, and
the insertion part is overlapped with the second hole, when viewed in plan view.

8. The vacuum socket of claim 1, further comprising a probe, passing through the concave portion of the lower housing and exposed to an external environment.

9. The vacuum socket of claim 1, further comprising a sealing layer between the concave portion and the printed circuit board.

10. The vacuum socket of claim 9, wherein the sealing layer comprises:
a polyimide film; and
silicon layers on top and bottom surfaces, respectively, of the polyimide film.

11. The vacuum socket of claim 1, further comprising:
an upper housing in contact with the lower housing and covering the cover.

12. The vacuum socket of claim 1, wherein the cover has a fourth hole, which is overlapped with the first hole and the second hole, when viewed in plan view.

13. A semiconductor testing system, comprising:
a loading part configured to convey first semiconductor chips;
a testing part including a contact tool configured to perform test and pick-up operations on the first semiconductor chips; and
an unloading part configured to unload the first semiconductor chips from the testing part,
wherein the contact tool has a plurality of vacuum sockets, and
each of the vacuum sockets comprises:
a lower housing including a concave portion with a lower hole, the concave portion having a recessed cross section;
a printed circuit board positioned in the concave portion, the printed circuit board having a penetration hole coupled to the lower hole;
a vacuum pad inserted in the lower hole coupled to the penetration hole; and
an upper housing on the lower housing, the upper housing having an upper hole overlapped with the lower hole, when viewed in plan view,
wherein the printed circuit board comprises at least one conduit, which is configured to allow air to flow from the penetration hole and the vacuum pad toward the upper hole and is used as an air flow pathway.

14. The semiconductor testing system of claim 13, wherein the loading part comprises a first loading part and a second loading part, which are configured to move the first semiconductor chips to the testing part.

15. The semiconductor testing system of claim 14, wherein the contact tool comprises:
a first contact tool adjacent to the first loading part; and
a second contact tool adjacent to the second loading part.

16. The semiconductor testing system of claim 13, wherein the conduit extends from the penetration hole toward an edge of the printed circuit board.

17. A vacuum socket, comprising:
a printed circuit board configured to load a semiconductor chip on a top surface thereof and having a penetration hole;
a cover on the semiconductor chip;
a lower housing covering side surfaces of the printed circuit board, the semiconductor chip and the cover, and a bottom surface of the printed circuit board, the lower housing having a lower hole coupled to and overlapped with the penetration hole, when viewed in plan view; and
a vacuum pad inserted in the lower hole,
wherein the printed circuit board has at least one conduit formed on a top surface thereof, the conduit being connected to the penetration hole and being used as an air flow pathway, allowing air to be pumped out to a region external the printed circuit board.

18. The vacuum socket of claim 17, wherein the conduit includes a recessed vertical section in a direction from a top surface toward a bottom surface of the printed circuit board.

19. The vacuum socket of claim 18, wherein the conduit has a depth ranging from 0.1 mm to 0.2 mm.

20. The vacuum socket of claim 17, wherein the conduit has a width ranging from 0.05 mm to 0.12 mm.

* * * * *